(12) United States Patent
Kosaka et al.

(10) Patent No.: US 9,645,485 B2
(45) Date of Patent: May 9, 2017

(54) HALFTONE PHASE SHIFT PHOTOMASK BLANK AND MAKING METHOD

(71) Applicant: SHIN-ETSU CHEMICAL CO., LTD., Tokyo (JP)

(72) Inventors: Takuro Kosaka, Joetsu (JP); Yukio Inazuki, Joetsu (JP); Hideo Kaneko, Joetsu (JP); Toyohisa Sakurada, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 109 days.

(21) Appl. No.: 14/816,637

(22) Filed: Aug. 3, 2015

(65) Prior Publication Data

US 2016/0033858 A1    Feb. 4, 2016

(30) Foreign Application Priority Data

Aug. 4, 2014  (JP) .................. 2014-158791
Jun. 26, 2015  (JP) .................. 2015-128725

(51) Int. Cl.
*G03F 1/32* (2012.01)
*G03F 1/26* (2012.01)
*G03F 1/60* (2012.01)

(52) U.S. Cl.
CPC ............... *G03F 1/32* (2013.01); *G03F 1/26* (2013.01); *G03F 1/60* (2013.01)

(58) Field of Classification Search
None
See application file for complete search history.

(56) References Cited

U.S. PATENT DOCUMENTS

| | | | |
|---|---|---|---|
| 5,474,864 A | 12/1995 | Isao et al. | |
| 6,045,954 A | 4/2000 | Dai et al. | |
| 7,179,545 B2 | 2/2007 | Okazaki et al. | |
| 7,767,366 B2 | 8/2010 | Yoshikawa et al. | |
| 7,771,893 B2 | 8/2010 | Yoshikawa et al. | |
| 7,935,461 B2 | 5/2011 | Nozawa et al. | |
| 7,941,767 B2 | 5/2011 | Mukai et al. | |
| 2002/0122991 A1 | 9/2002 | Shiota et al. | |
| 2012/0064438 A1* | 3/2012 | Yoshikawa | G03F 1/32 430/5 |
| 2015/0125785 A1 | 5/2015 | Inazuki et al. | |
| 2015/0338731 A1 | 11/2015 | Nozawa et al. | |

FOREIGN PATENT DOCUMENTS

| | | |
|---|---|---|
| EP | 2 871 520 A2 | 5/2015 |
| JP | 7-140635 A | 6/1995 |
| JP | 10-171096 A | 6/1998 |
| JP | 2004-133029 A | 4/2004 |
| JP | 2007-33469 A | 2/2007 |
| JP | 2007-233179 A | 9/2007 |
| JP | 2007-241065 A | 9/2007 |
| JP | 2008-276002 A | 11/2008 |
| JP | 2010-9038 A | 1/2010 |
| WO | WO 2014/112457 A1 | 7/2014 |

OTHER PUBLICATIONS

Extended European Search Report issued May 23, 2016, in European Patent Application No. 15179457.5.
Faure et al., "Characterization of Binary and Attenuated Phase Shift Mask Blanks for 32nm Mask Fabrication", Photomask Technology, Proc. of SPIE, 2008, vol. 7122, pp. 712209-1 to 712209-12.

* cited by examiner

*Primary Examiner* — Stephen Rosasco
(74) *Attorney, Agent, or Firm* — Birch, Stewart, Kolasch & Birch, LLP

(57) ABSTRACT

A halftone phase shift photomask blank comprising a transparent substrate and a halftone phase shift film consisting of silicon, nitrogen and optional oxygen, and providing a phase shift of 150°-200° relative to light of wavelength up to 200 nm. The phase shift film includes at least one layer meeting the formula: $2 \times O/Si + 3 \times N/Si \geq 3.5$ wherein Si is a silicon content (at %), N is a nitrogen content (at %), and O is an oxygen content (at %). The phase shift film exhibits satisfactory in-plane uniformity of transmittance.

4 Claims, No Drawings

HALFTONE PHASE SHIFT PHOTOMASK BLANK AND MAKING METHOD

CROSS-REFERENCE TO RELATED APPLICATION

This non-provisional application claims priority under 35 U.S.C. §119(a) on Patent Application Nos. 2014-158791 and 2015-128725 filed in Japan on Aug. 4, 2014 and Jun. 26, 2015, respectively, the entire contents of which are hereby incorporated by reference.

TECHNICAL FIELD

This invention relates to a halftone phase shift photomask blank which is processed into a halftone phase shift photomask for use in the microfabrication of semiconductor integrated circuits or the like, and a method for preparing the photomask blank.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are minimized by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing light interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of a phase shift of approximately 180 degrees and having an insufficient transmittance to contribute to pattern formation. As the halftone phase shift photomask, JP-A H07-140635 proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, JP-A 2008-276002 describes that if the photomask is cleaned at a predetermined stage, then the photomask can be continuously used.

CITATION LIST

Patent Document 1: JP-A H07-140635
Patent Document 2: JP-A 2008-276002 (U.S. Pat. No. 7,941,767)
Patent Document 3: JP-A 2010-009038
Patent Document 4: JP-A 2007-033469
Patent Document 5: JP-A 2007-233179
Patent Document 6: JP-A 2007-241065
Patent Document 7: JP-A H10-171096
Patent Document 8: JP-A 2004-133029
Non-Patent Document 1: Thomas Faure et al., "Characterization of binary mask and attenuated phase shift mask blanks for 32 nm mask fabrication," Proc. of SPIE, vol. 7122, pp 712209-1 to 712209-12

SUMMARY OF INVENTION

The photomask technology has the tendency that with a progress of miniaturization, the pattern width becomes smaller than the exposure wavelength. Accordingly, RET technologies such as OPC, modified illumination, immersion lithography, phase shift method, and double exposure are employed as mentioned above. In the phase shift method, a halftone phase shift film with transmittance about 6% is conventionally used. When it is desired to form a pattern with a narrower width, for example, a pattern with a half pitch of up to 50 nm by photolithography, a phase shift film with a higher transmittance is necessary to gain a higher contrast ratio. Specifically, a phase shift film having a phase shift of about 180 degrees and a transmittance of 10% to 40% is needed.

A halftone phase shift photomask with a higher transmittance may be manufactured by a method of forming a phase shift film on a transparent substrate of quartz or the like and digging the substrate until a phase shift of 180° is reached, for example, a method of forming a phase shift film providing a low transmittance of about 6% and a phase shift of 180° at a predetermined thickness, to a thickness thinner than the predetermined thickness so as to provide a high transmittance, and compensating for a shortage of phase shift by digging (or etching) until a phase shift of 180° is reached, or a method of forming a SiO film for phase adjustment and a Cr film for transmittance adjustment in combination, for tailoring transmittance in a controlled manner.

However, the photomask obtained by digging the substrate is difficult in accurate control of a phase shift and also difficult to make corrections when defects are formed in the pattern. On the other hand, the two-layer photomask using two films having different etch properties, typically SiO film and Cr film has drawbacks including an increased number of etching steps involved in pattern formation and an increased film thickness in 100 nm or more to produce a phase shift of 180°.

As improvements in these respects, Patent Document 3 discloses a film composed mainly of metal, silicon, and nitrogen. The film is as thick as 74 nm. However, a thinner film is advantageous for pattern formation and effective for reducing 3D effect. Thus, a thinner film is required in order for photolithography to form a finer pattern.

On use of a photomask blank in the photomask producing process, if foreign deposits are on the photomask blank, they cause pattern defects. To remove foreign deposits, the photomask blank is cleaned many times during the photomask producing process. Further, when the photomask thus produced is used in the photolithography process, the photomask is also repeatedly cleaned even if the photomask itself is free of pattern defects, for the reason that if foreign deposits settle on the photomask during the photolithography process, a semiconductor substrate which is patterned using that photomask eventually bears pattern-transfer failures.

For removing foreign deposits from the photomask blank or photomask, chemical cleaning is applied in most cases, using SPM, ozone water or AMP. SPM is a sulfuric acid/hydrogen peroxide mixture which is a cleaning agent having strong oxidizing action. Ozone water is water having ozone dissolved therein and used as a replacement of SPM. AMP is an aqueous ammonia/hydrogen peroxide mixture. When the photomask blank or photomask having organic foreign deposits on its surface is immersed in the AMP cleaning liquid, the organic foreign deposits are liberated and removed from the surface under the dissolving action of ammonia and the oxidizing action of hydrogen peroxide.

Although the chemical cleaning with such chemical liquid is necessary for removing foreign deposits such as particles and contaminants on the photomask blank or photomask, the chemical cleaning can damage an optical film, typically halftone phase shift film, on the photomask blank or photomask. For example, if the surface of an optical film is altered by chemical cleaning, the optical properties that the film originally possesses can be changed. In addition, chemical cleaning of the photomask blank or photomask is repeatedly carried out. It is thus necessary to minimize any property change (e.g., phase shift change) of the optical film during every cleaning step.

Among the films meeting the above requirements are transition metal-free films consisting of silicon and nitrogen, and transition metal-free films consisting of silicon, nitrogen, and oxygen, which have improved chemical resistance. These films, however, are difficult to control their optical properties including phase shift and transmittance. In particular, it is difficult to form a film having in-plane uniformity of optical properties at a given transmittance.

An object of the invention is to provide a halftone phase shift photomask blank having a halftone phase shift film containing silicon, and either or both of nitrogen and oxygen, being free of transition metals, and having in-plane uniformity of optical properties, and a method for preparing the photomask blank.

As the halftone phase shift film having chemical resistance, attention was paid to halftone phase shift films containing silicon, and either or both of nitrogen and oxygen, but not transition metals. A study was made to develop halftone phase shift films which are improved in in-plane uniformity of optical properties while maintaining a predetermined phase shift. Regarding transition metal-free, silicon-containing films, the inventors have found that as the amount of nitrogen and oxygen added to silicon is gradually increased from the zero level, the in-plane uniformity of film is once aggravated in a zone of moderate addition and then improved in a subsequent zone of more addition.

As the halftone phase shift film providing a phase shift of 150° to 200° relative to light of wavelength up to 200 nm, a halftone phase shift film which consists of silicon and nitrogen, or silicon, nitrogen and oxygen and is a single layer meeting the formula (1), defined below, or a multilayer film including at least one layer meeting the formula (1) is formed on a transparent substrate. This halftone phase shift film takes the advantage of a layer of silicon base material which is rich in nitrogen and oxygen and free of transition metals, maintains the predetermined phase shift, and has chemical resistance and in-plane uniformity of optical properties. The invention is predicated on this finding.

In one aspect, the invention provides a halftone phase shift photomask blank comprising a transparent substrate and a halftone phase shift film thereon, the halftone phase shift film consisting of silicon and nitrogen, or silicon, nitrogen and oxygen, and providing a phase shift of 150° to 200° relative to light of wavelength up to 200 nm. The halftone phase shift film is a single layer meeting the formula (1) or a multilayer film including at least one layer meeting the formula (1):

$$2 \times O/Si + 3 \times N/Si \geq 3.5 \qquad (1)$$

wherein Si is a content (at %) of silicon, N is a content (at %) of nitrogen, and O is a content (at %) of oxygen.

Preferably, in the layer meeting the formula (1), the content of oxygen is up to ⅓ of the content of nitrogen as expressed in atomic ratio.

Preferably the halftone phase shift film is a multilayer film including at least one layer consisting of silicon and nitrogen and at least one layer consisting of silicon, nitrogen and oxygen.

In another aspect, the invention provides a method for preparing a halftone phase shift photomask blank comprising a transparent substrate and a halftone phase shift film thereon, said halftone phase shift film consisting of silicon and nitrogen, or silicon, nitrogen and oxygen, and providing a phase shift of 150° to 200° relative to light of wavelength up to 200 nm, the method comprising the step of effecting deposition of silicon, nitrogen and optional oxygen under controlled conditions to adjust the contents of nitrogen and optional oxygen such that the halftone phase shift film may be a single layer meeting the formula (1) or a multilayer film including at least one layer meeting the formula (1).

ADVANTAGEOUS EFFECTS OF INVENTION

In connection with a halftone phase shift photomask blank having a halftone phase shift film containing silicon, and either or both of nitrogen and oxygen, but not transition metals, the invention is successful in providing a halftone phase shift film having chemical resistance and in-plane uniformity of optical properties while maintaining the predetermined phase shift.

DESCRIPTION OF PREFERRED EMBODIMENTS

The invention is directed to a halftone phase shift photomask blank comprising a transparent substrate such as quartz substrate and a film formed thereon from a silicon base material consisting of silicon and nitrogen, or silicon, nitrogen and oxygen. The film of silicon base material is formed as a halftone phase shift film. The halftone phase shift film should preferably have a predetermined transmittance (for example, 10% to 40%) and a predetermined phase shift (specifically, 150° to)200° relative to light of wavelength up to 200 nm, specifically ArF excimer laser light (193 nm) or $F_2$ laser light (157 nm) commonly used in photolithography using halftone phase shift photomasks.

The halftone phase shift film is formed as a single layer or a multilayer film including a plurality of layers, typically two to four layers. At least one layer of the halftone phase shift film, that is, the single layer or at least one layer of the multilayer film should meet the formula (1):

$$2 \times O/Si + 3 \times N/Si \geq 3.5 \qquad (1)$$

wherein Si is a content (at %) of silicon, N is a content (at %) of nitrogen, and O is a content (at %) of oxygen. For example, the overall halftone phase shift film, that is, all layers may meet the formula (1). The halftone phase shift film including a layer meeting the formula (1) has improved in-plane uniformity of optical properties, especially optical density (OD) and transmittance. When deposition of silicon, nitrogen and optional oxygen is carried out under controlled conditions to adjust the content of nitrogen and optional oxygen such that a halftone phase shift film may be a single layer meeting the formula (1) or a multilayer film including at least one layer meeting the formula (1), there is obtained a halftone phase shift film having a high transmittance and minimized variation of quality.

The halftone phase shift film should preferably have a transmittance of at least 10%, which ensures a necessary and sufficient contrast when a pattern with a half pitch of up to 50 nm, especially up to 30 nm is formed by photolithography, and even when a pattern with a half pitch of up to 20 nm is formed by photolithography. For higher contrast, the transmittance should preferably be at least 15% while the upper limit is preferably up to 40%, especially up to 30%.

The phase shift of the halftone phase shift film is such that a phase shift between the exposure light transmitted by a region of phase shift film (phase shift region) and the exposure light transmitted by a neighboring region where the phase shift film is removed, causes interference of exposure light whereby contrast is increased. Specifically the phase shift is 150 to 200 degrees. Although ordinary phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°.

The thickness of the halftone phase shift film should preferably be up to 70 nm, more preferably up to 65 nm, further preferably up to 64 nm, most preferably up to 62 nm, because a thinner film facilitates to form a finer pattern and a photomask pattern of certain thickness is effective for reducing 3D effect. The lower limit of the film thickness is set in the range where the desired optical properties are obtained relative to light of wavelength up to 200 nm, specifically at least 40 nm, more specifically at least 50 nm. In the embodiment wherein the phase shift film is a multilayer film, the thickness of the layer meeting formula (1) (if two or more layers meeting formula (1) are included, the total thickness thereof) is preferably at least 60% of the total thickness of the phase shift film, and preferably up to 100%, more preferably up to 90%, and even more preferably up to 80% of the total thickness of the phase shift film. Further in the embodiment wherein the phase shift film is a multilayer film, the layer meeting formula (1) may be disposed adjacent to or remote from the transparent substrate, or at an intermediate in thickness direction.

The silicon base material of the halftone phase shift film is specifically silicon nitride (SiN) or silicon oxynitride (SiON). Containment of another element is acceptable insofar as the content is an impurity or trace level.

In the layer meeting formula (1), the content of silicon is preferably at least 40 at % and also preferably up to 50 at %. With a silicon content within the range, the contents of nitrogen and oxygen are adjusted so as to meet formula (1), leading to an increase of refractive index. In the layer meeting formula (1), the content of oxygen is preferably up to 15 at %, more preferably up to 10 at %, and even more preferably up to 5 at %. In the layer meeting formula (1), the content of nitrogen is preferably at least 40 at %, more preferably at least 50 ata, and also preferably up to 60 at %, more preferably up to 55 at %.

In order that the halftone phase shift film may be thin, a film with a lower oxygen content is preferred. For this reason, in the layer meeting formula (1), especially in the overall halftone phase shift film, the oxygen content is preferably up to ⅓, more preferably up to ⅕ of the nitrogen content as expressed in atomic ratio, or even oxygen may not be present. It is effective from this standpoint that the halftone phase shift film is formed of an oxygen-free silicon base material, that is, a material consisting of silicon and nitrogen. In this embodiment, the halftone phase shift film may have a single layer structure, a multilayer structure including at least two layers having different silicon/nitrogen ratios, or a compositionally graded structure wherein the silicon/nitrogen ratio changes stepwise or continuously in thickness direction.

For the halftone phase shift film formed solely of silicon and nitrogen, sometimes its transmittance cannot be increased beyond a certain limit, and the film cannot be endowed with the desired optical properties. Such a problem may be overcome by constructing the halftone phase shift film as a multilayer structure including a high oxygen content layer and a low oxygen content layer. Specifically, the halftone phase shift film may be a multilayer structure including at least one layer of silicon base material consisting of silicon, nitrogen and oxygen as the high oxygen content layer and at least one layer of silicon base material consisting of silicon, nitrogen and oxygen and having a lower oxygen content than the high oxygen content layer as the low oxygen content layer; or a multilayer structure including at least one layer of silicon base material consisting of silicon, nitrogen and oxygen as the high oxygen content layer and at least one layer of silicon base material consisting of silicon and nitrogen as the low oxygen content layer.

Inversely, when it is desired to reduce transmittance, for example, below 10%, a layer containing transition metal and silicon may be used as the low nitrogen or oxygen content layer or a layer other than the layer meeting formula (1), for thereby reducing transmittance. In this embodiment, preferably a silicon base material layer having a low oxygen or nitrogen content may be used, because chemical resistance is further improved.

The multilayer structure mentioned above is also effective for reducing the thickness of the halftone phase shift film. It is possible to achieve an increase of transmittance by increasing the content of nitrogen as much as possible, while supplementing a shortage of transmittance by adding a necessary minimum amount of oxygen. Then the content of oxygen can be suppressed to a minimum level. This eventually allows the halftone phase shift film to be thinned. In this case too, each layer of the multilayer structure may have a graded composition wherein the silicon/nitrogen/oxygen or silicon/nitrogen ratio changes stepwise or continuously in thickness direction.

With respect to the arrangement of a high oxygen content layer and a low oxygen content layer in the halftone phase shift film, for example, the high oxygen content layer may be disposed remotest from the transparent substrate (i.e., on surface side) or closest to the transparent substrate (i.e., on substrate side). Either structure is effective for reducing reflectivity. From the standpoint of improving the controlled etching of the halftone phase shift film, for example, improving the accuracy of end detection, it is most effective that the low oxygen content layer is disposed closest to the substrate. Exemplary of the multilayer structure are a two-layer structure consisting of a high oxygen content layer and a low oxygen content layer, a three-layer structure having two high oxygen content layers on the surface and substrate sides of a low oxygen content layer, and an alternating layer structure of at least four alternating high and low oxygen content layers.

The halftone phase shift film may be formed by any well-known film deposition techniques. Among others, the sputtering technique is preferred because a homogeneous film is readily formed. The sputtering technique may be either DC sputtering or RF sputtering. A choice of target and sputter gas depends on the layer construction and composition. The target used herein may be a silicon target, silicon nitride target, or target containing both silicon and silicon nitride. The contents of nitrogen and oxygen may be adjusted by effecting reactive sputtering using nitrogen-containing gas and oxygen-containing gas as the reactive sputter gas while adjusting the feed rates of these gases. Examples of the reactive gas include nitrogen gas ($N_2$ gas), oxygen gas ($O_2$ gas), and nitrogen oxide gases ($N_2O$, NO and $NO_2$ gases). As the sputter gas, a rare gas such as helium, neon or argon gas may also be used.

In the embodiment wherein the halftone phase shift film has a multilayer structure, a surface oxidized layer may be formed as a surface-side layer (or outermost surface layer) in order to suppress any change in quality of the halftone phase shift film. The surface oxidized layer may have an oxygen content of at least 20 at %, with even an oxygen content of at least 50 at % being acceptable. The surface oxidized layer may be formed by oxidation, for example, atmospheric or air oxidation, or forced oxidative treatment. The forced oxidative treatment of a silicon base material film may be performed, for example, by treating with ozone gas or ozone water, or by heating at a temperature of about 300° C. in an oxygen-containing atmosphere via oven heating, lamp annealing or laser heating. The surface oxidized layer may preferably have a thickness of up to 10 nm, more preferably up to 5 nm, and even more preferably up to 3 nm, and a thickness of at least 1 nm is sufficient to be effective as an oxide layer. Although the surface oxidized layer may also be formed by increasing the flow rate of oxygen during the sputtering process, the atmospheric oxidation or oxidative treatment mentioned above is recommended to form a substantially defect-free layer.

In the case of a halftone phase shift mask blank, like conventional halftone phase shift mask blanks, a light-shielding film may be formed on the halftone phase shift film in order to define a shielding region of fully shielding exposure light. Although the light-shielding film may be made of any desired materials, a film of chromium base material which can be also utilized as an auxiliary film for etching process is preferred. With respect to the construction and composition of the light-shielding film, a number of reports are known, for example, from Patent Documents 4 and 5. Preferably the light-shielding film is constructed by forming a Cr base light-shielding film, and further depositing thereon a Cr base antireflective film for reducing reflection from the light-shielding film. The light-shielding film and antireflective film each may be a single layer or a multilayer structure. The materials for the Cr base light-shielding film and antireflective film include chromium alone, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

The Cr base light-shielding film and antireflective film may be deposited by reactive sputtering. The reactive sputtering process uses a target of chromium alone or a target of chromium having one or more of oxygen, nitrogen and carbon added thereto. The sputtering gas is a rare gas such as Ar, He or Ne, to which a gas selected from oxygen-containing gas, nitrogen-containing gas and carbon-containing gas in accordance with the desired composition of a film being deposited is added.

In another version of the embodiment wherein a light-shielding film is provided, an auxiliary film or etch stop film of chromium base material as disclosed in Patent Document 6 may be formed on the halftone phase shift film, and a light-shielding film of silicon, a silicon base compound or transition metal/silicon base compound be formed thereon.

Furthermore, a hard mask film may be formed on the light-shielding film. As the hard mask film, a film having different etching properties from the light-shielding film is desirable. For example, when the light-shielding film is a Cr base film, a film which can be etched with fluoride gas such as $SF_6$ or $CF_4$ is preferably used as the hard mask film. Suitable hard mask films include a silicon film, a film containing silicon and nitrogen and/or oxygen, and a film containing silicon, nitrogen and/or oxygen, and a transition metal such as molybdenum, tantalum or zirconium.

The photomask blank may be processed into a photomask by a standard technique. For example, a halftone phase shift mask blank comprising a halftone phase shift film and a light-shielding film or antireflective film of chromium base material deposited thereon may be processed as follows. First, a resist film adapted for electron beam (EB) lithography is formed on the chromium base material film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the chromium base material film. Next, while the chromium base material film pattern is used as etching mask, fluorine base dry etching is carried out for transferring the pattern to the halftone phase shift film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift photomask.

In another example, a halftone phase shift mask blank comprising a halftone phase shift film, a light-shielding film or antireflective film of chromium base material deposited thereon, and a hard mask film of silicon base material deposited thereon may be processed as follows. First, a resist film adapted for EB lithography is formed on the silicon base hard mask film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the silicon base hard mask film. Thereafter, oxygen-containing chlorine base dry etching is carried out for transferring the hard mask film pattern to the chromium base material film. The resist is removed at this point. Further, while the chromium base material film pattern is used as etching mask, fluorine base dry etching is carried out for transferring the pattern to the halftone phase shift film and at the same time, removing the silicon base hard mask film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift photomask.

In a photolithographic method for forming a pattern with a half pitch of up to 50 nm, typically up to 30 nm, and more typically up to 20 nm in a processable substrate, comprising the steps of forming a photoresist film on the processable substrate and exposing the photoresist film to light of wavelength up to 200 nm, typically ArF excimer laser (193 nm) or $F_2$ laser (157 nm), through a patterned mask for transferring the pattern to the photoresist film, the halftone phase shift photomask of the invention is best suited for use in the exposure step.

The halftone phase shift photomask obtained from the photomask blank is advantageously applicable to the pattern forming process comprising projecting light to the photomask pattern including the pattern of halftone phase shift film for transferring the photomask pattern to an object (photoresist film) on the processable substrate. The irradiation of exposure light may be either dry exposure or immersion exposure. The halftone phase shift photomask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto.

Examples 1 to 4, Comparative Examples 1, 2

On a quartz substrate of 152 mm squares and 6.35 mm thick, a layer of SiN was deposited by a sputtering process using a silicon target as the sputter target and nitrogen and argon gases as the sputter gas, or a layer of SiON was deposited by a sputtering process using a silicon target as the sputter target and nitrogen, oxygen and argon gases as the sputter gas. The deposition conditions were adjusted such that the deposited layers each might provide a phase shift of about 175°. In this way, there were obtained photomask blanks each having a halftone phase shift film of single layer structure.

The halftone phase shift films thus obtained were analyzed for composition by X-ray photoelectron spectrometer (XPS) system K-Alpha® (Thermo Fisher Scientific). Contents (at %) of oxygen, nitrogen and silicon thus measured are shown in Table 1 together with values of A which are computed from these contents according to the equation (1-1):

$$A=2\times O/Si+3\times N/Si \quad (1\text{-}1)$$

wherein Si is a content (at %) of silicon, N is a content (at %) of nitrogen, and O is a content (at %) of oxygen.

For the halftone phase shift films, using a phase shift/transmittance measuring system MPM193 (Lasertec Corp.), a distribution of transmittance of light with wavelength 193 nm was measured in an area of about 134 mm× about 134 mm inside a region which is defined by connecting 4 points diagonally spaced 95 mm from the center of the square surface of quartz substrate. From the transmittance measurements, a value was computed according to the formula (2):

$$(T_{max}-T_{min})/(T_{max}+T_{min}) \quad (2)$$

wherein $T_{max}$ is the maximum of transmittance (%) and $T_{min}$ is the minimum of transmittance (%), the value being reported as a variation of transmittance in Table 1.

TABLE 1

| | | Film composition | O (at %) | N (at %) | Si (at %) | Thickness (nm) | A value | Variation of transmittance (%) |
|---|---|---|---|---|---|---|---|---|
| Example | 1 | SiON | 2 | 53 | 45 | 61 | 3.62 | 0.8 |
| | 2 | SiN | 0 | 54 | 46 | 60 | 3.52 | 4.9 |
| | 3 | SiON | 8 | 48 | 44 | 64 | 3.64 | 1.4 |
| | 4 | SiON | 13 | 44 | 43 | 67 | 3.67 | 3.3 |
| Comparative Example | 1 | SiN | 0 | 53 | 47 | 62 | 3.38 | 13.0 |
| | 2 | SiON | 1 | 51 | 48 | 64 | 3.23 | 13.8 |

Example 5

On a quartz substrate of 152 mm squares and 6.35 mm thick, a layer of SiN was deposited by a sputtering process using a silicon target as the sputter target and nitrogen and argon gases as the sputter gas. A layer of SiON was deposited on the SiN layer by a sputtering process using a silicon target as the sputter target and nitrogen, oxygen and argon gases as the sputter gas. In this way, there was obtained a photomask blank having a halftone phase shift film of two layers: SiN layer and SiON layer. The deposition time was adjusted in the SiN depositing step such that the SiN layer might have a thickness of 45 nm, and in the SiON depositing step such that the overall halftone phase shift film might have a phase shift of 180°. As a result, the SiON layer had a thickness of 21 nm, and the overall halftone phase shift film had a thickness of 66 nm.

The halftone phase shift film thus obtained was analyzed for composition by the same XPS as in Example 1. The SiN layer consisted of 46 at % silicon and 54 at % nitrogen, with an A value of 3.52. The SiON layer consisted of 39 at % silicon, 40 at % oxygen and 21 at % nitrogen, with an A value of 3.67. For the halftone phase shift film, a distribution of transmittance was measured as in Example 1, from which a variation of transmittance was computed to be 1.1%.

It is evident from these results that the halftone phase shift film meeting formula (1) has satisfactory in-plane uniformity of transmittance.

Japanese Patent Application Nos. 2014-158791 and 2015-128725 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift photomask blank comprising a transparent substrate and a halftone phase shift film thereon, said halftone phase shift film consisting of silicon and nitrogen, or silicon, nitrogen and oxygen, and providing a phase shift of 150° to 200° relative to light of wavelength up to 200 nm, said halftone phase shift film being a single layer meeting the formula (1) or a multilayer film including at least one layer meeting the formula (1):

$$2 \times O/Si + 3 \times N/Si \geq 3.5 \tag{1}$$

wherein Si is a content (at %) of silicon, N is a content (at %) of nitrogen, and O is a content (at %) of oxygen.

2. The photomask blank of claim 1 wherein in the layer meeting the formula (1), the content of oxygen is up to ⅓ of the content of nitrogen as expressed in atomic ratio.

3. The photomask blank of claim 1 wherein said halftone phase shift film is a multilayer film including at least one layer consisting of silicon and nitrogen and at least one layer consisting of silicon, nitrogen and oxygen.

4. A method for preparing a halftone phase shift photomask blank comprising a transparent substrate and a halftone phase shift film thereon, said halftone phase shift film consisting of silicon and nitrogen, or silicon, nitrogen and oxygen, and providing a phase shift of 150° to 200° relative to light of wavelength up to 200 nm, said method comprising the step of effecting deposition of silicon, nitrogen and optional oxygen under controlled conditions to adjust the contents of nitrogen and optional oxygen such that the halftone phase shift film may be a single layer meeting the formula (1) or a multilayer film including at least one layer meeting the formula (1):

$$2 \times O/Si + 3 \times N/Si \geq 3.5 \tag{1}$$

wherein Si is a content (at %) of silicon, N is a content (at %) of nitrogen, and O is a content (at %) of oxygen.

* * * * *